United States Patent
Weaver et al.

(10) Patent No.: US 9,231,227 B2
(45) Date of Patent: Jan. 5, 2016

(54) OLED DISPLAY ARCHITECTURE

(75) Inventors: Michael S. Weaver, Princeton, NJ (US); Michael Hack, Princeton, NJ (US); Lou Silverstein, Scottsdale, AZ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 397 days.

(21) Appl. No.: 13/284,466

(22) Filed: Oct. 28, 2011

(65) Prior Publication Data

US 2013/0105833 A1    May 2, 2013

(51) Int. Cl.
  *H01L 51/50*  (2006.01)
  *H01L 51/52*  (2006.01)
  *H01L 27/32*  (2006.01)

(52) U.S. Cl.
  CPC ........ *H01L 51/5203* (2013.01); *H01L 27/3209* (2013.01); *H01L 27/3216* (2013.01); *H01L 27/3218* (2013.01)

(58) Field of Classification Search
  CPC ..... H01L 33/08; H01L 33/00; H01L 51/5044; H01L 51/50; H01L 51/504; H01L 51/5036
  USPC .......................................................... 257/89
  See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A * | 12/1997 | Forrest et al. | 313/506 |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,384,529 B2 * | 5/2002 | Tang et al. | 313/506 |
| 6,468,819 B1 | 10/2002 | Kim et al. | |
| 7,038,373 B2 * | 5/2006 | Arnold et al. | 313/506 |
| 7,279,704 B2 | 10/2007 | Walters et al. | |
| 7,431,968 B1 | 10/2008 | Shtein et al. | |
| 7,714,500 B2 * | 5/2010 | Hirakata et al. | 313/504 |
| 8,159,426 B2 * | 4/2012 | Chang et al. | 345/82 |

(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Benjamin Sandvik
(74) *Attorney, Agent, or Firm* — Morris & Kamlay LLP

(57) ABSTRACT

A first device is provided. The first device comprises an integrated OLED structure disposed over a single substrate. The integrated OLED structure includes a blue-emitting OLED, a green emitting OLED, and a red emitting OLED. The blue emitting OLED has a first active area defined by a first electrode of the blue emitting OLED disposed in a first plane. The green emitting OLED has a second active area. The red emitting OLED has a third active area. The second and third active areas are disposed in a second plane different from and parallel to the first plane. Each of the second and third active areas are at least partially superposed with the first active area.

25 Claims, 8 Drawing Sheets

(56) References Cited

U.S. PATENT DOCUMENTS

| | | | |
|---|---|---|---|
| 8,471,943 B2* | 6/2013 | Ito | H01L 27/3209 348/333.01 |
| 8,674,598 B2* | 3/2014 | Vaufrey | H01L 27/3211 313/504 |
| 2003/0230980 A1 | 12/2003 | Forrest et al. | |
| 2004/0061107 A1* | 4/2004 | Duggal | 257/40 |
| 2004/0174116 A1 | 9/2004 | Lu et al. | |
| 2010/0187988 A1* | 7/2010 | Forrest et al. | 313/504 |
| 2010/0219427 A1* | 9/2010 | Fukuda | 257/89 |
| 2011/0095279 A1* | 4/2011 | Mizuno | H01L 27/3206 257/40 |
| 2011/0248294 A1* | 10/2011 | Weaver et al. | 257/89 |
| 2012/0112642 A1* | 5/2012 | Ikeda | H01L 27/3202 315/161 |
| 2014/0159023 A1* | 6/2014 | Matsumoto | H01L 51/0061 257/40 |

OTHER PUBLICATIONS

Baldo et al., "Very high-efficiency green organic light-emitting devices based on electrophosphorescence," Appl. Phys. Lett., vol. 75, No. 3, 4-6 (1999).

Silverstein et al, "Hybrid spatial-temporal color synthesis and its applications," Journal of the SID 14/1, 2006.

* cited by examiner

OLED DISPLAY ARCHITECTURE

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices, and more specifically to the use of red, green and blue organic light emitting devices to render color.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for organic emissive molecules is a full color display. Industry standards for such a display call for pixels adapted to emit particular colors, referred to as "primary" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the structure of Formula I:

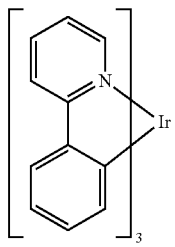

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A first device is provided. The first device comprises an integrated OLED structure disposed over a single substrate. The integrated OLED structure includes a blue-emitting OLED, a green emitting OLED, and a red emitting OLED. The blue emitting OLED has a first active area defined by a first electrode of the blue emitting OLED disposed in a first plane. The green emitting OLED has a second active area. The red emitting OLED has a third active area. The second and third active areas are disposed in a second plane different from and parallel to the first plane. Each of the second and third active areas are at least partially superposed with the first active area.

In one embodiment, each of the second and third active areas are completely superposed with the first active area.

In one embodiment of the first device, the first and second planes are separated by a common electrode that is common to the blue emitting OLED, the green emitting OLED and the red emitting OLED. This embodiment may be referred to as a "common cathode" embodiment. In one example of a specific structure of this embodiment, the integrated OLED structure includes, in order disposed over the substrate:

(1) an electrode layer CA that includes a first electrode of the red emitting OLED and a first electrode of the green emitting OLED,
(2) a non-emitting organic layer CB common to the red emitting and green emitting OLEDs;
(3) an emitting layer CC that includes an emitting layer of the green emitting OLED that corresponds to the second active area, and an emitting layer of the red emitting OLED that corresponds to the third active area;
(4) a non-emitting layer CD common to the red emitting and green emitting OLEDs;
(5) an electrode layer CE that includes the common electrode, wherein the common electrode is the second electrode of the green emitting OLED, the second electrode of the red emitting OLED, and the first electrode of the blue emitting OLED;
(6) an emitting layer CF that includes an emitting layer of the blue emitting OLED;
(7) an electrode layer CO that includes a second electrode of the blue emitting OLED.

In further embodiments of the common cathode embodiment, the first electrode of the red emitting OLED, the first electrode of the green emitting OLED, and the second electrode of the blue emitting OLED may be separately addressable, or alternatively may not be separately addressable. Both configurations have advantages.

In a further embodiment of the common cathode embodiment, the first electrode of the red emitting OLED and the first electrode of the green emitting OLED are anodes, the second electrode of the green emitting OLED, the second electrode of the red emitting OLED, and the first electrode of the blue emitting OLED are cathodes, and the second electrode of the blue emitting OLED is an anode.

In one embodiment, the first and second planes are separated by a passivation layer. This embodiment may be referred to as a "passivation layer" embodiment. In one example of a specific structure of this embodiment, the integrated OLED structure includes, in order disposed over the substrate:

(1) an electrode layer PA that includes a first electrode of the blue emitting OLED;
(2) an emitting layer PB that includes an emitting layer of the blue emitting OLED;
(3) an electrode layer PC that includes a second electrode of the blue emitting OLED;
(4) a passivation layer PD;
(5) an electrode layer PE that includes a first electrode of the red emitting OLED and a first electrode of the green emitting OLED,
(6) a non-emitting organic layer PF common to the red emitting and green emitting OLEDs;
(7) an emitting layer PG that includes an emitting layer of the green emitting OLED that corresponds to the second active area, and an emitting layer of the red emitting OLED that corresponds to the third active area;
(8) a non-emitting layer PH common to the red emitting and green emitting OLEDs;
(9) an electrode layer PI that includes a common electrode, wherein the common electrode is the second electrode of the green emitting OLED, and the second electrode of the red emitting OLED.

In further embodiments of the passivation layer embodiment, the first electrode of the red emitting OLED, the first electrode of the green emitting OLED, and the second electrode of the blue emitting OLED may be separately addressable, or alternatively may not be separately addressable. Both configurations have advantages.

In a further embodiment of the passivation layer embodiment, the first electrode of the red emitting OLED and the first electrode of the green emitting OLED are anodes; the second electrode of the green emitting OLED and the second electrode of the red emitting OLED are cathodes; the first electrode of the blue emitting OLED is an anode; and the second electrode of the blue emitting OLED is a cathode.

In one embodiment, the integrated OLED structure comprises exactly one green emitting OLED and exactly one red emitting OLED superposed with exactly one blue emitting OLED. In this embodiment, the first active area is preferably at least 1.5 time greater than the sum of the second and third active areas.

In one embodiment, the integrated OLED structure comprises exactly two green emitting OLEDs and exactly two red emitting OLEDs superposed with exactly one blue emitting OLED. In this embodiment, the first active area is preferably at least 2.25 times greater than the sum of the second and third active areas.

In one embodiment, the integrated OLED structure comprises exactly three green emitting OLEDs and exactly three red emitting OLEDs superposed with exactly one blue emitting OLED. In this embodiment, the first active area is at least 2.083 times time greater than the sum of the second and third active areas.

In one embodiment, the integrated OLED structure comprises exactly eight green emitting OLEDs and exactly eight red emitting OLEDs superposed with exactly one blue emitting OLED. In this embodiment, the first active area is preferably at least 3 times time greater than the sum of the second and third active areas.

The first device may be a consumer product.
The first device may be an OLED panel.
Preferably, the red emitting OLED, the green emitting OLED and the blue emitting OLED are phosphorescent OLEDs.

In one embodiment, a method of fabricating an integrated OLED structure having a common cathode disposed over a single substrate is also provided. The integrated OLED structure includes a blue-emitting OLED, a green emitting OLED, and a red emitting OLED. The blue emitting OLED has a first active area defined by a first electrode of the blue emitting OLED disposed in a first plane. The green emitting OLED has a second active area. The red emitting OLED has a third active area. The second and third active areas are disposed in a second plane superposed with the first plane. The first and second planes are separated by a common electrode that is common to the blue emitting OLED, the green emitting OLED and the red emitting OLED. The method comprises depositing, in order, over a substrate:

(1) an electrode layer CA that includes a first electrode of a red emitting OLED and a first electrode of a green emitting OLED;
(2) a non-emitting organic layer CB common to the red emitting and green emitting OLEDs;
(3) an emitting layer CC that includes an emitting layer of the green emitting OLED that corresponds to the second active area, and an emitting layer of the red emitting OLED that corresponds to the third active area;
(4) a non-emitting layer CD common to the red emitting and green emitting OLEDs;
(5) an electrode layer CE that includes the common electrode, wherein the common electrode is the second electrode of the green emitting OLED, the second electrode of the red emitting OLED, and the first electrode of the blue emitting OLED;
(6) an emitting layer CF that includes an emitting layer of the blue emitting OLED;
(7) an electrode layer CG that includes a second electrode of the blue emitting OLED.

In one embodiment, a method of fabricating an integrated OLED structure having a passivation layer disposed over a single substrate is also provided. The integrated OLED structure includes a blue-emitting OLED, a green emitting OLED, and a red emitting OLED. The blue emitting OLED has a first active area defined by a first electrode of the blue emitting OLED disposed in a first plane. The green emitting OLED has a second active area. The red emitting OLED has a third active area. The second and third active areas are disposed in a second plane superposed with the first plane. The first and second planes are separated by a passivation layer. The method comprises depositing, in order, over a substrate:

(1) an electrode layer PA that includes a first electrode of the blue emitting OLED;
(2) an emitting layer PB that includes an emitting layer of the blue emitting OLED;
(3) an electrode layer PC that includes a second electrode of the blue emitting OLED;
(4) a passivation layer PD;
(5) an electrode layer PE that includes a first electrode of the red emitting OLED and a first electrode of the green emitting OLED,
(6) a non-emitting organic layer PF common to the red emitting and green emitting OLEDs;
(7) an emitting layer PG that includes an emitting layer of the green emitting OLED that corresponds to the second active area, and an emitting layer of the red emitting OLED that corresponds to the third active area;
(8) a non-emitting layer PH common to the red emitting and green emitting OLEDs; and
(9) an electrode layer PI that includes a common electrode, wherein the common electrode is the second electrode of the green emitting OLED, and the second electrode of the red emitting OLED.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
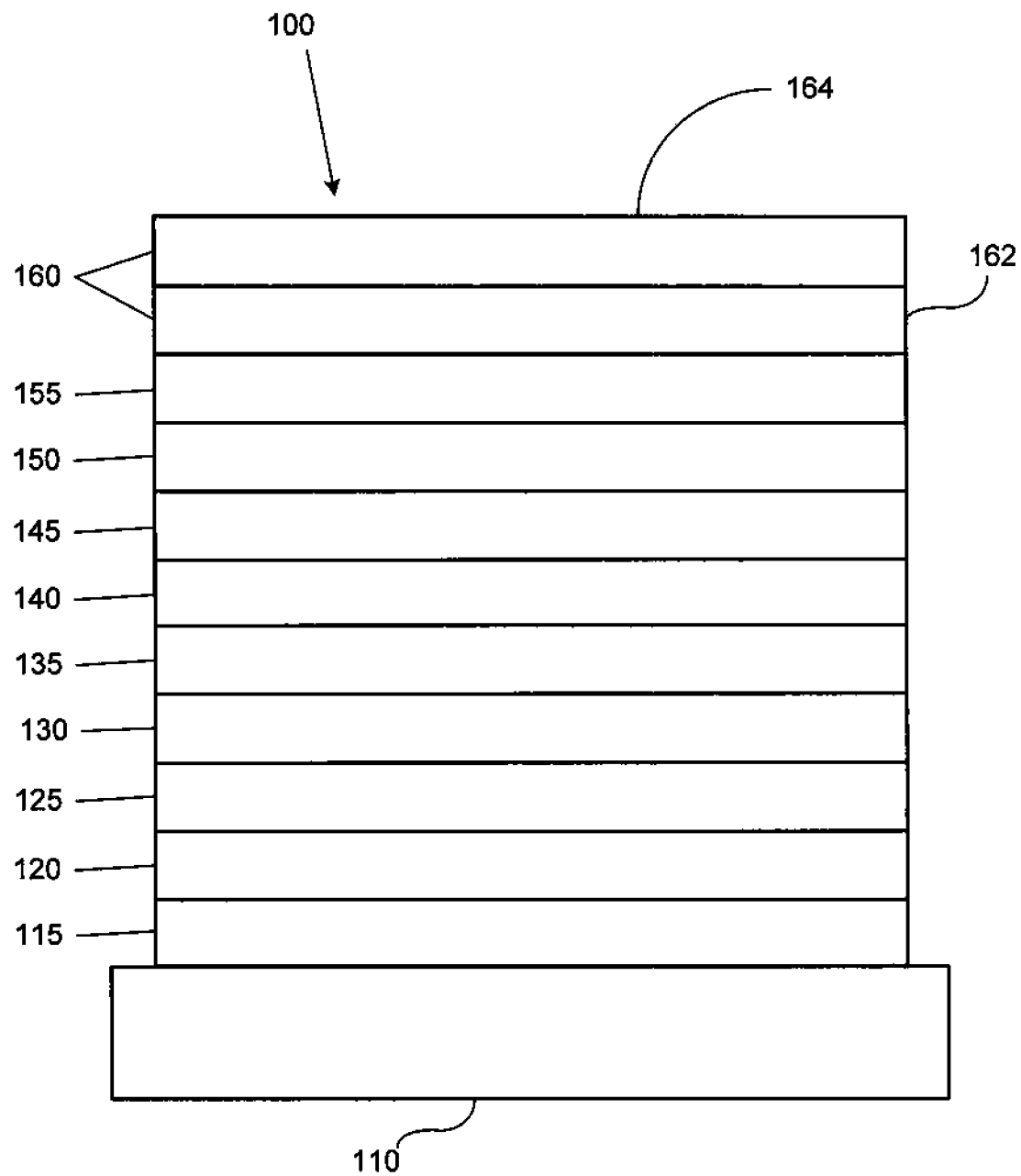
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
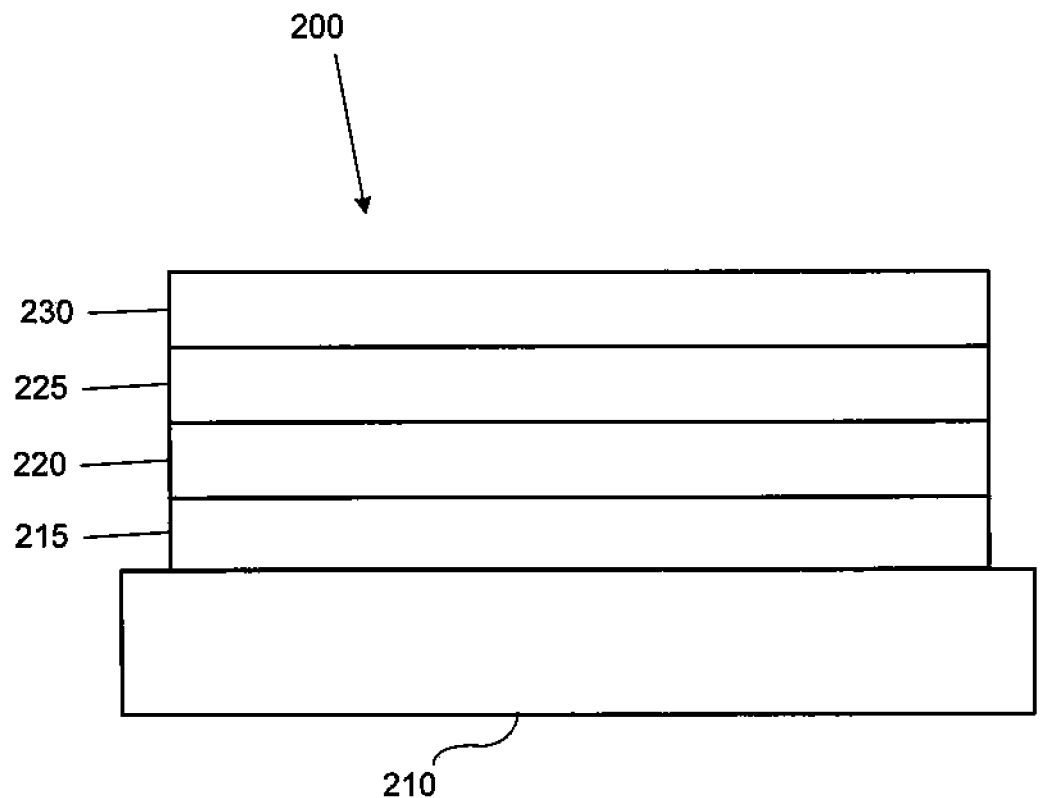
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, high resolution monitors for health care applications, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

One application for organic emissive molecules is a full color display, preferably an active matrix OLED (AMOLED) display. One factor that currently limits AMOLED display lifetime and power consumption is the lack of a commercially available blue OLED with high color purity and sufficient device lifetime.

Figure 3:
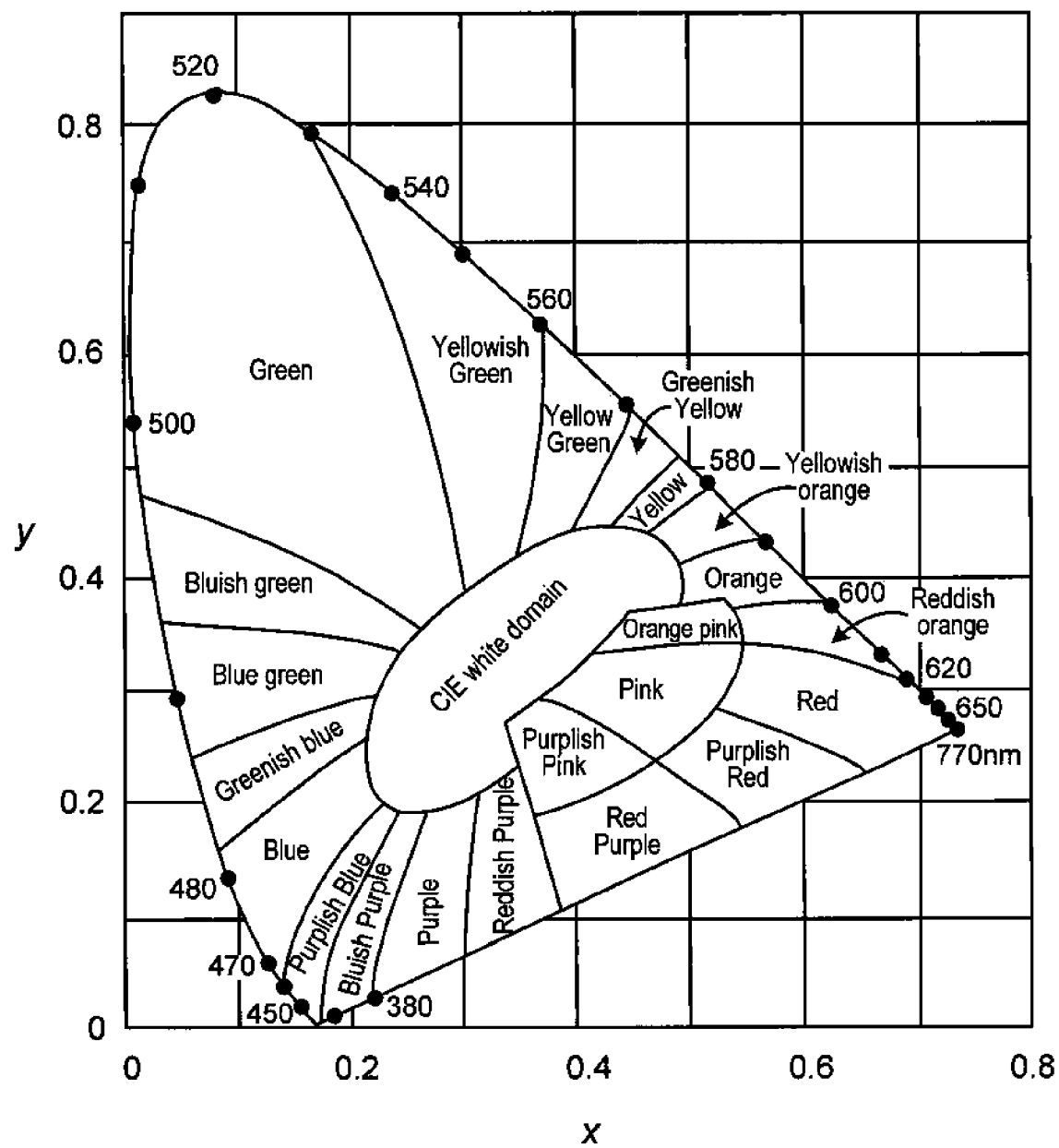
FIG. 3 shows a rendition of the 1931 CIE chromaticity diagram.

FIG. 3 shows the 1931 CIE chromaticity diagram, developed in 1931 by the International Commission on Illumination, usually known as the CIE for its French name Commission Internationale de l'Eclairage. Any color can be described by its x and y coordinates on this diagram. A high purity or "saturated" color corresponds to a spectral power distribution (SPD) concentrated within a narrow band of visible wavelengths. The higher the purity of a color, the closer its CIE x and y coordinates fall on the CIE diagram near the U-shaped curve running from blue through green to red known as the spectral locus. The numbers along this curve refer to the dominant wavelength of the color, that is the wavelength which correlates with the perceived hue of the color. A color composed of a single wavelength, such as the light emitted by a laser, represents a color of the highest possible purity or saturation. The CIE coordinates of such a color would fall directly on the spectrum locus.

Figure 4:
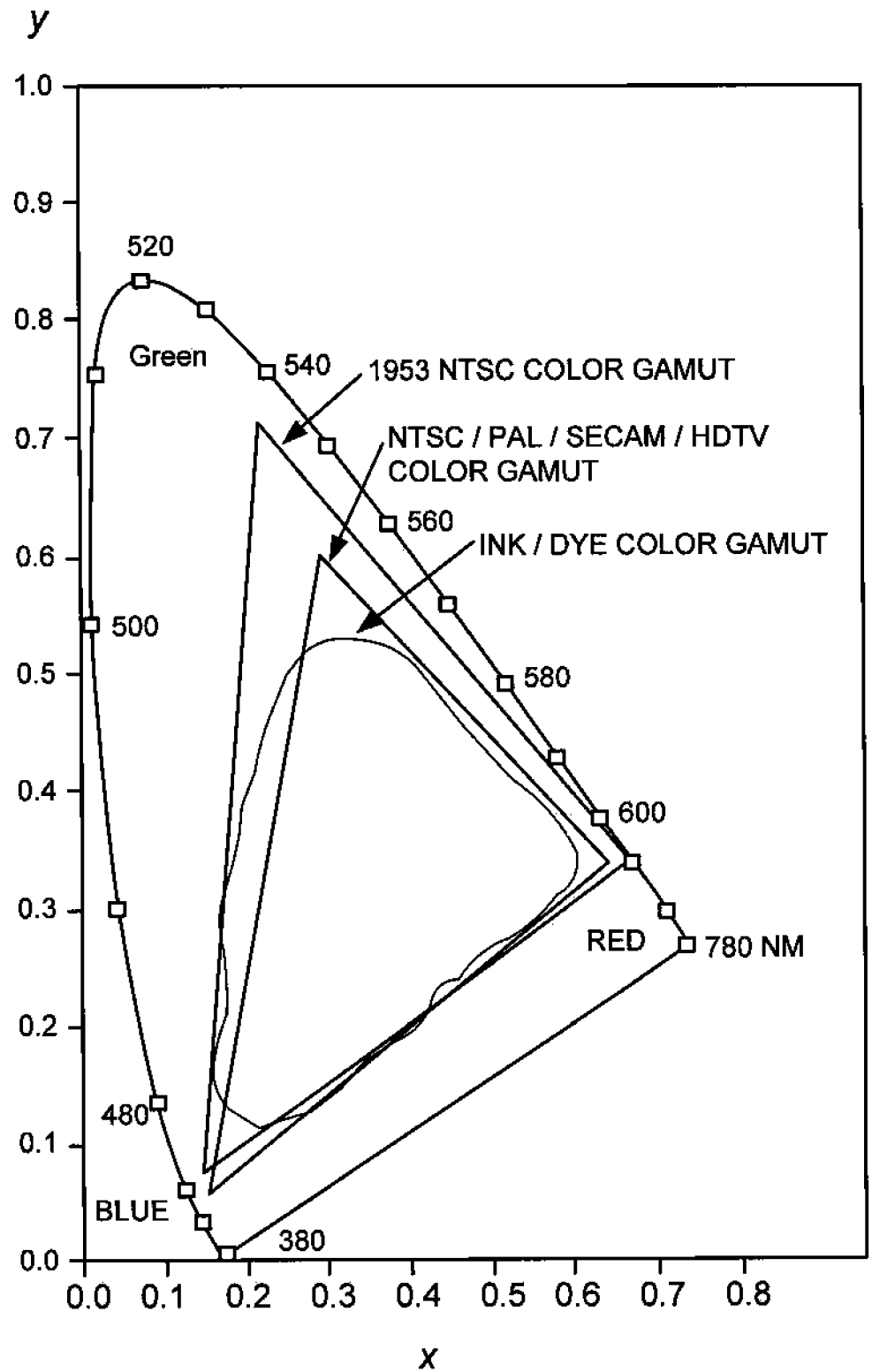
FIG. 4 shows a rendition of the 1931 CIE chromaticity diagram that also shows color gamuts.

FIG. 4 shows another rendition of the 1931 chromaticity diagram, which also shows several color "gamuts." A color gamut the outer boundary or envelope of possible colors that may be rendered by a particular display or other means of rendering color. In general, any given light-emitting device has an emission spectrum with a particular CIE coordinate. Emission from two devices can be combined in various intensities to render color having a CIE coordinate anywhere on the line between the CIE coordinates of the two devices. Emission from three devices can be combined in various intensities to render colors having CIE coordinates anywhere in the triangle defined by the respective coordinates of the three devices on the CIE diagram. The three points of each of the triangles in FIG. 4 represent two of the industry standard sets of CIE coordinates which define color gamuts for displays along with an ink/dye color gamut for comparison purposes. For example, the three vertices of the triangle labeled "NTSC/PAL/SECAM/HDTV gamut" represent the colors of the red, green and blue (RGB) primaries called for in the sub-pixels of a display that complies with the standards listed. A full-color pixel having sub-pixels that emit the specified RGB primary colors can render any color on the boundary or within the triangle by suitable adjustment of the intensity of emission from each sub-pixel.

The CIE 1931 x,y coordinates called for by NTSC standards are: red (0.67, 0.33); green (0.21, 0.72); blue (0.14, 0.08). However, other specific CIE coordinates for red, green and blue may be used depending upon the context or the desired standard.

A first device is provided. The first device comprises an integrated OLED structure disposed over a single substrate. The integrated OLED structure includes a blue-emitting OLED, a green emitting OLED, and a red emitting OLED. The blue emitting OLED has a first active area defined by a first electrode of the blue emitting OLED disposed in a first plane. The green emitting OLED has a second active area. The red emitting OLED has a third active area. The second and third active areas are disposed in a second plane different from and parallel to the first plane. Each of the second and third active areas are at least partially superposed with the first active area.

As used herein, a first area and a second area are "superposed," when the second area is parallel to and translated normal to the first area, and has at least some overlap when viewed normal to the planes of the areas.

Figure 6:
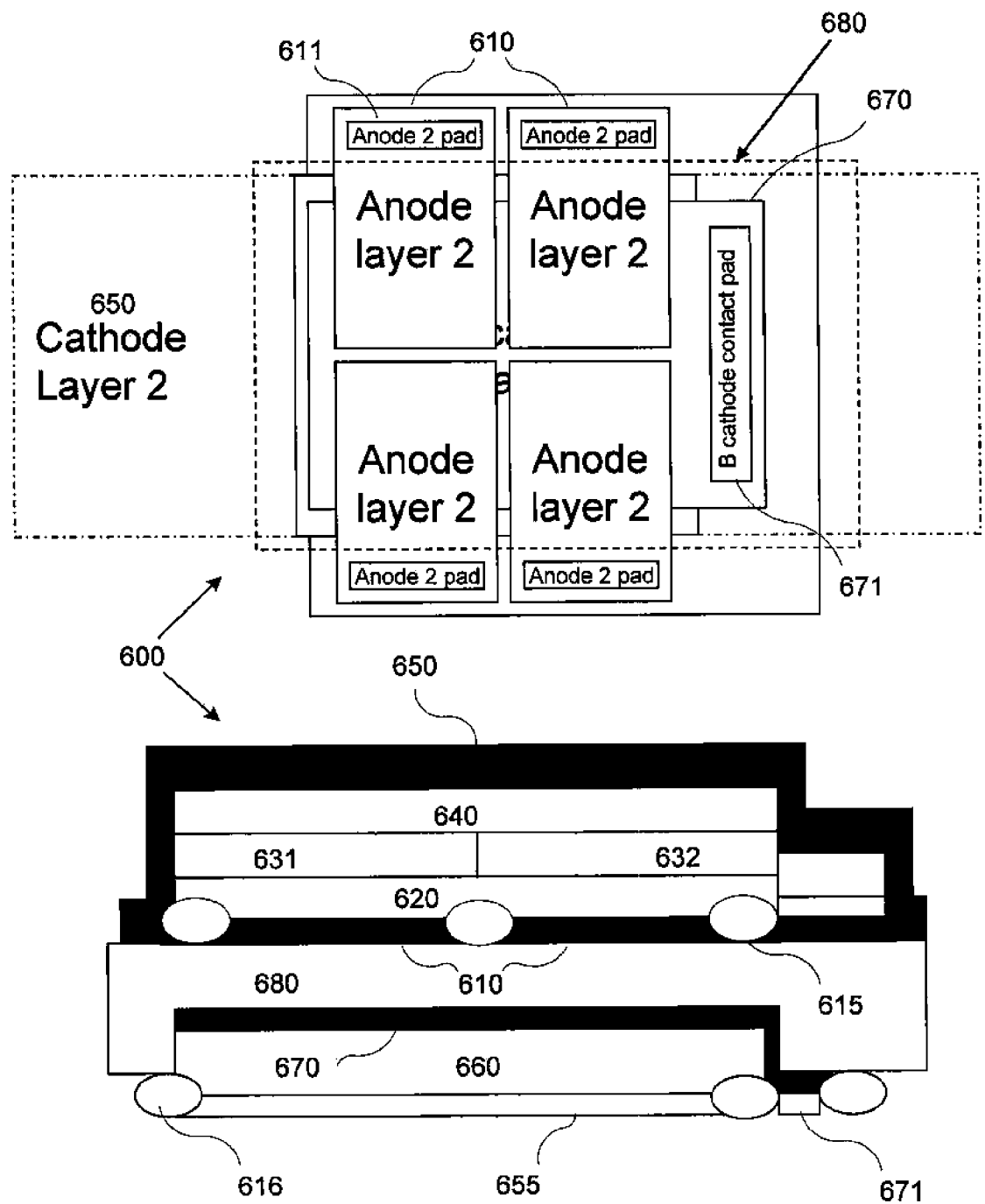
FIG. 6 shows a specific device architecture 600 for R, G and B devices split between two device planes having a passivation layer between the two device planes.
Figure 7:
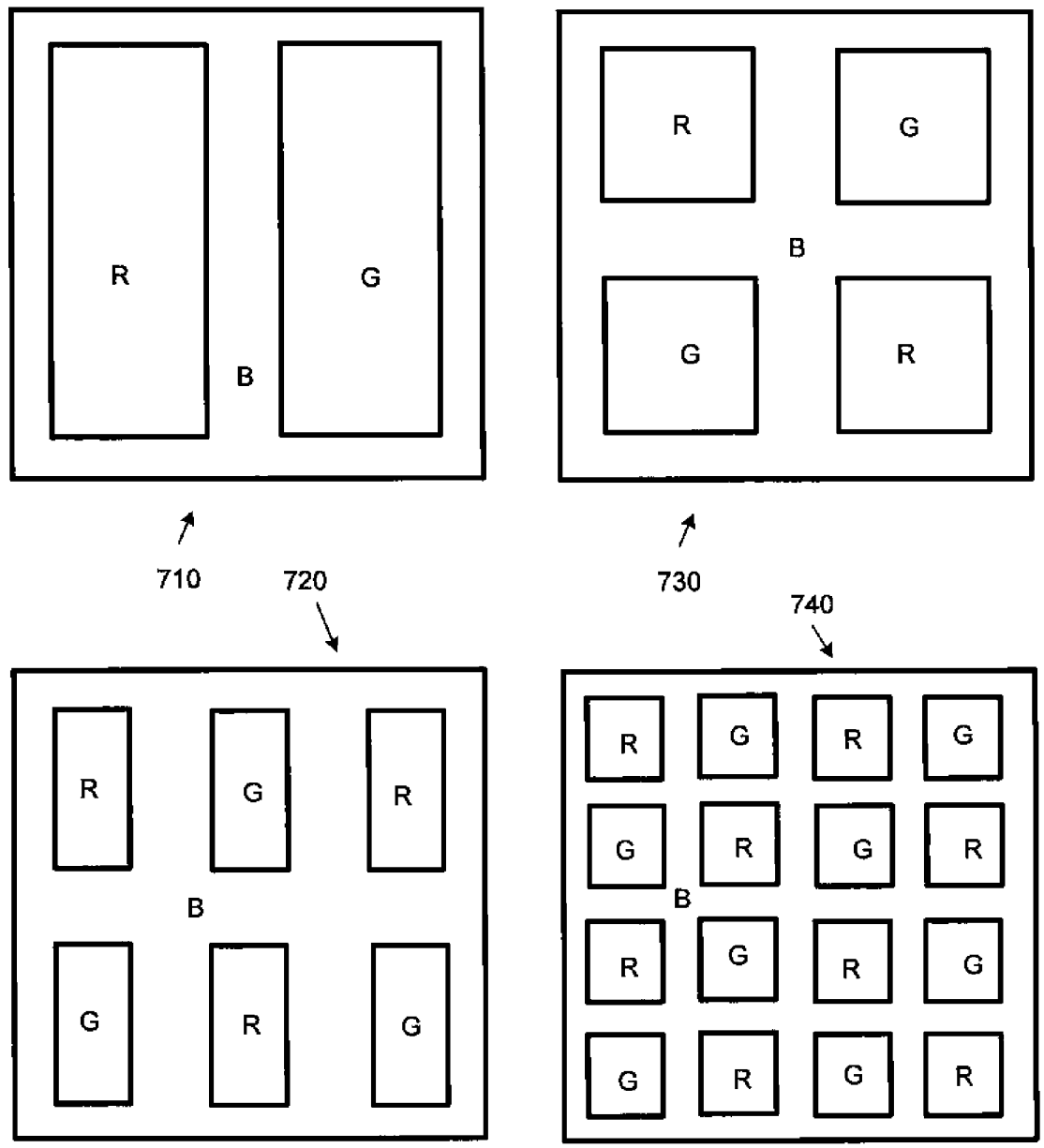
FIG. 7 shows possible configurations for 1×2, 2×2, 3×2 and 4×4 arrays of red and green OLEDs superposed with a single blue OLED.
Figure 8:
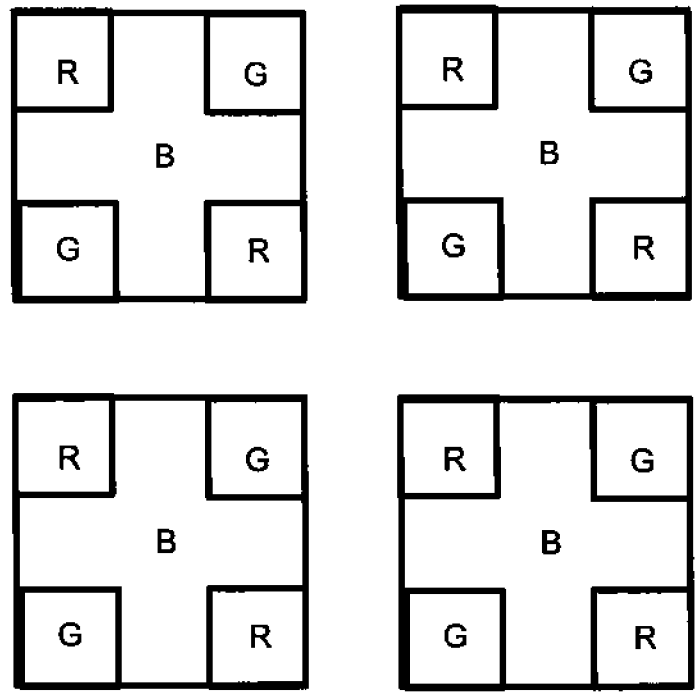
FIG. 8 illustrates how it is possible to obtain an active area B that is significantly greater than the sum of active areas R and G, due to non-emitting areas between red and green devices.

The structures described are advantageous for several reasons. First, having the active area of the blue device in a first plane, and the active areas of the red and green devices in a second plane, allows for more blue active area relative to a single plane construction, because the red and green devices share a plane whereas the blue devices have an entire plane to themselves. The larger area for the blue device is advantageous because it allows the blue device to be run at a lower current density, which is useful because blue OLEDs often have lifetime and stability issues relative to red and green devices, and the lower current density mitigates these issues. There are several ways that this two-plane architecture could be implemented. One way would be to use blue-red stacked OLEDs and blue-green stacked OLEDs. A structure having separate red-blue and green-blue stacks would result in an active area for the blue devices roughly twice that of the red devices and twice that of the green devices, or equal to that of the red and green devices combined. This is because in both the plane of the blue devices and the plane of the green and red devices, the overall fill factor is about the same, and there is significant area in both the plane of the blue devices and the plane of the red and green devices that is in between the active area. This architecture is less desirable than many of those disclosed herein. Another way is to provide an integrated structure where a blue device in a first plane has an active area defined by a single first electrode, and is superposed with multiple red and green devices in a second plane. By using a single electrode for the blue device that is superposed with multiple red and green devices, the fill factor of the blue device plane can be significantly increased. A single electrode for the blue electrode may be implemented as shown, for example, in FIGS. 5 and 6. FIGS. 7 and 8 illustrate how this structure results in an active area for the blue device that is greater than the sum of the active areas of the red and green devices combined.

In one embodiment, each of the second and third active areas are completely superposed with the first active area.

Common Cathode Embodiments

In one embodiment of the first device, the first and second planes are separated by a common electrode that is common to the blue emitting OLED, the green emitting OLED and the red emitting OLED. This embodiment may be referred to as a "common cathode" embodiment. In one example of a specific structure of this embodiment, the integrated OLED structure includes, in order disposed over the substrate:

(1) an electrode layer CA that includes a first electrode of the red emitting OLED and a first electrode of the green emitting OLED, (2) a non-emitting organic layer CB common to the red emitting and green emitting OLEDs;

(3) an emitting layer CC that includes an emitting layer of the green emitting OLED that corresponds to the second active area, and an emitting layer of the red emitting OLED that corresponds to the third active area; the red emitting and green emitting layers may be deposited at different times within step (3)

(4) a non-emitting layer CD common to the red emitting and green emitting OLEDs;

(5) an electrode layer CE that includes the common electrode, wherein the common electrode is the second electrode of the green emitting OLED, the second electrode of the red emitting OLED, and the first electrode of the blue emitting OLED;

(6) an emitting layer CF that includes an emitting layer of the blue emitting OLED;

an electrode layer CG that includes a second electrode of the blue emitting OLED.

Figure 5:
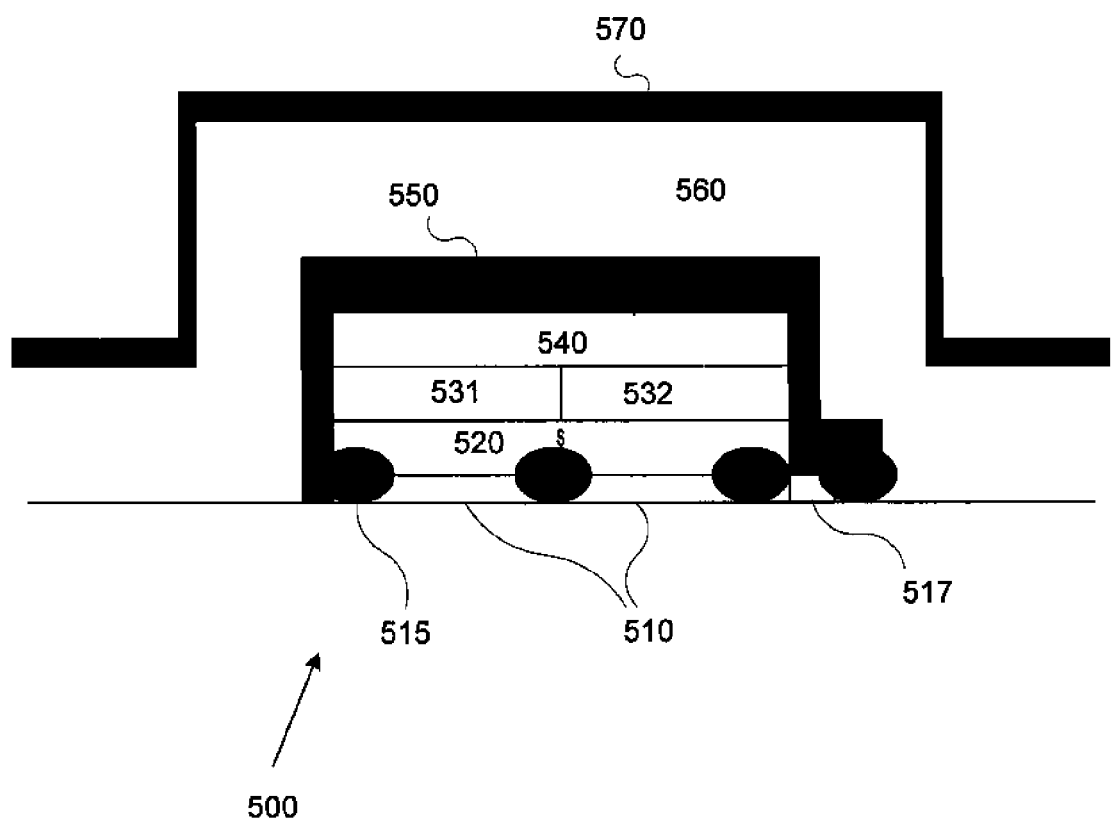
FIG. 5 shows a specific device architecture 500 for R, G, and B devices split between two device planes having a common electrode between the two device planes.

The letters CA, CB, and so on through CG refer to layers in the device structure. Any particular layer may have one or more patterned features therein. With reference to FIG. 5, the layers described above correspond as follows:

CA—anodes 510
CB—hole transport layer 520
CC—emissive layers 531 and 532
CD—electron transport layer 540
CE—electrode 550
CF—emissive layer 560
CG—cathode 570

While FIG. 5 is a specific embodiment that describes a particular arrangement of anodes and cathodes, the letters CA through CG are described in more general terms and are intended to encompass any arrangement of layers that involves an electrode shared by the two superposed device planes.

FIG. 5 shows a specific device architecture 500 for a R, G, and B devices split between two device planes having a common electrode between the two device planes. In FIGS. 5 and 6, where no arrow or connecting line is present, a reference numeral refers to the layer on which it appears. The architecture includes anodes 510 for each of an R and G device that are individually addressable and electrically separated by insulating grid 515. Electronics that are most often located in the substrate, such as transistors and contact pads for each anode, are not shown. An organic hole transport layer 520 common to each of the R and G devices is disposed over anodes 510. Individually patterned organic emissive layers 531 and 532, for R and G devices, respectively, are disposed aver organic hole transport layer 520. Individually patterned organic emissive layers 531 and 532 include different emissive materials suitable for use with R and G devices, respectively. An organic electron transport layer 540 common to each of the R and G devices is disposed over emissive layers 531 and 532. An electrode 550 is disposed over organic electron transport layer 540, and is also connected to contact pad 517. Electrode 550 acts as a cathode for the R and G devices, and as an anode for the B device. Organic emissive layer 560, which includes an emissive material suitable for use with a B device, is disposed over electrode 550. Cathode 570 is disposed over organic emissive layer 560. In general, electrodes that are not disposed directly on the substrate make contact to circuitry on the substrate outside of the blue active device area. Bus lines may be used in conjunction with any given electrode, particularly if light is emitted through the electrode.

The device of FIG. 5 may include layers in addition to those specifically illustrated. For example, the blue device may include non-emissive electron and hole transport layers in addition to the illustrated emissive layer 560. By way of further example, injection layers, blocking layers, and other layers may be included in the devices in addition to those illustrated.

In further embodiments of the common cathode embodiment, the first electrode of the red emitting OLED, the first electrode of the green emitting OLED, and the second electrode of the blue emitting OLED may be separately addressable, or alternatively may not be separately addressable. Both configurations have advantages. Separately addressable electrodes allow the red, green and blue devices to be independently controlled, which enables the device as a whole to be controlled to render a wide variety of chromaticities and luminances, as would be desired, for example, in a full color display. However, separately controllable electrodes are achieved through the use of circuitry that has some associated cost. Such circuitry is well known to the art. Electrodes that are not separately addressable could be achieved with much simpler circuitry, once again known to the art, but result in a device where the relative emission of red, green and blue is relatively fixed. This configuration would be desirable for a light source used for illumination.

In a further embodiment of the common cathode embodiment, the first electrode of the red emitting OLED and the first electrode of the green emitting OLED are anodes, the second electrode of the green emitting OLED, the second electrode of the red emitting OLED, and the first electrode of the blue emitting OLED are cathodes, and the second electrode of the blue emitting OLED is an anode. In general, organic materials in any non-emissive layers of a device are preferably chosen to efficiently transport holes from an anode to the emissive layer, and to efficiently transport electrodes from a cathode to the emissive layer. So the description of a particular electrode as an anode or a cathode has consequences for how the rest of the layers in the device are selected.

Passivation Layer Embodiments

In one embodiment, the first and second planes are separated by a passivation layer. This embodiment may be referred to as a "passivation layer" embodiment. In one example of a specific structure of this embodiment, the integrated OLED structure includes, in order disposed over the substrate:

(1) an electrode layer PA that includes a first electrode of the blue emitting OLED;
(2) an emitting layer PB that includes an emitting layer of the blue emitting OLED;
(3) an electrode layer PC that includes a second electrode of the blue emitting OLED;
(4) a passivation layer PD;
(5) an electrode layer PE that includes a first electrode of the red emitting OLED and a first electrode of the green emitting OLED,
(6) a non-emitting organic layer PF common to the red emitting and green emitting OLEDs;
(7) an emitting layer PG that includes an emitting layer of the green emitting OLED that corresponds to the second active area, and an emitting layer of the red emitting OLED that corresponds to the third active area; the red emitting and green emitting layers may be deposited at different times within step (7)
(8) a non-emitting layer PH common to the red emitting and green emitting OLEDs;
(9) an electrode layer PI that includes a common electrode, wherein the common electrode is the second electrode of the green emitting OLED, and the second electrode of the red emitting OLED.

The letters PA, PB, and so on through PI refer to layers in the device structure. Any particular layer may have one or more patterned features therein. With reference to FIG. 6, the layers described above correspond as follows:

PA—anode 655
PB—emissive layer 660
PC—cathode 670
PD—passivation layer 680
PE—anodes 610
PF—hole transport layer 620
PG—emissive layers 631 and 632
PH—electron transport layer 640
PI—electrode 650

While FIG. 6 is a specific embodiment that describes a particular arrangement of anodes and cathodes, the letters PA through PI are described in more general terms and are intended to encompass any arrangement of layers that involves a passivation layer that separates the two superposed device planes.

FIG. 6 shows a specific device architecture 600 for a R, G and B devices split between two device planes having a passivation layer 680 between the two device planes. The top figure is a top-down view, and the bottom figure is a cross section of the top figure. For ease of illustration, the top figure shows only most of the electrodes and the passivation layer. It is understood that organic layers and anode 655 are appropriately located as illustrated in the bottom figure. The architecture includes anodes 610 for each of an R and G device that are individually addressable and electrically separated by insulating grid 615. Anodes 610 (also described as anode layer 2) contact anode pads 611 (also described as anode pad 2) on the substrate, visible in the top figure. An organic hole transport layer 620 common to each of the R and G devices is disposed over anodes 610. Individually patterned organic emissive layers 631 and 632, for R and G, respectively, are disposed over organic hole transport layer 620. Individually patterned organic emissive layers 631 and 632 include different emissive materials suitable for use with R and G devices, respectively An organic electron transport layer 640 common to each of the R and G devices is disposed over emissive layers 631 and 632. Residual parts of organic hole and transport layers 620 and 640 are disposed to the right of organic emissive layer 632. An electrode 650 is disposed over organic electron transport layer 640, and is also connected to. Electrode 650 (also described as cathode layer 2) acts as a cathode for the R and G devices. A passivation layer 680 separates the B device from the R and G devices. Organic emissive layer 660, which includes an emissive material suitable for use with a B device, is disposed between anode 655 and cathode 670. Anode 655 is connected to a contact pad on an underlying substrate (not shown). Cathode 670 is connected to contact pad 671, which is also on the underlying substrate. Insulating grid 616 separates the B device from adjacent B devices (not shown). In general, electrodes that are not disposed directly on the substrate make contact to circuitry on the substrate outside of the blue active device area. Bus lines may be used in conjunction with any given electrode, particularly if light is emitted through the electrode. Electrode 650 is an example of an electrode where a bus line may be preferred.

In the structure of FIG. 6, the passivation layer preferably has an index of refraction selected to maximize outcoupling. The thicknesses of the organic layers are preferably selected to optimize any desirable cavity effects. In one embodiment, passivation layer 680 and cathode 650 may be stripes that extend to edges of the display. In another embodiment, passivation layer 680 may extend over cathode 670, but be pixilated to allow contact pads for cathode 650 to connect to bus lines, which desirably enhance conductivity, which is particularly useful in larger displays.

The device of FIG. 6 may include layers in addition to those specifically illustrated, as described with respect to FIG. 5.

Any layers disposed between a viewer and a layer that emits light that the viewer is intended to see transmit a suitable amount of such light. It is well known how to make a transparent OLED.

In further embodiments of the passivation layer embodiment, the first electrode of the red emitting OLED, the first electrode of the green emitting OLED, and the second electrode of the blue emitting OLED may be separately addressable, or alternatively may not be separately addressable. Both configurations have advantages, as described with respect to FIG. 5.

In a further embodiment of the passivation layer embodiment, the first electrode of the red emitting OLED and the first electrode of the green emitting OLED are anodes; the second electrode of the green emitting OLED and the second electrode of the red emitting OLED are cathodes; the first electrode of the blue emitting OLED is an anode; and the second electrode of the blue emitting OLED is a cathode. As described with respect to FIG. 5, designating a particular electrode as an anode or a cathode determines preferences for many of the other layers in the device.

Because organic materials often have an absorption spectra with a peak at an energy somewhat higher than its emission spectra, many red and green emitter layers may absorb blue light. As a result, it is preferred that devices described herein are designed to emit light towards a viewer on the "blue" side of the device. Any electrodes (and other layers) disposed between the viewer and an emissive layer are preferably transparent. However, other arrangements may also be used. This point, and subsequent discussion, applies to both common cathode and passivation layer embodiments.

It is also preferred that circuitry is located on the non-viewer side of the device, as, for example, in a top-emission device with circuitry in the substrate. However, other arrangements may be used. For example, control circuitry may be transparent, may be sufficiently small that it blocks an acceptably small percentage of light, or may be placed in the (less frequent) spaces between blue devices.

While preferred positions relative to the viewer for the circuitry and the different color devices are described, various other positions may also be used.

Ratio of Blue to Red and Green and Fill Factor

Device structures including a passivation layer, as well as device structures with a common electrode, may be used with various ratios of red, green and blue devices. FIG. 7 shows some examples. Device structure 710 shows the active area B of a single blue emitting OLED superposed with the active areas R and G of a single red and a single green OLED. Device structure 720 shows the active area B of a single blue emitting OLED superposed with the active areas R and G of two red and two green OLEDs. Device structure 730 shows the active area B of a single blue emitting OLED superposed with the active areas R and G of three red and three green OLEDs. Device structure 740 shows the active area B of a single blue emitting OLED superposed with the active areas R and G of eight red and eight green OLEDs.

FIG. 7 shows equal numbers of green and red OLEDs. While it is preferred that the number of red OLEDs in the device be equal to the number of green OLEDs, i.e., that the ratio of red to green OLEDs is 1:1, it is not necessary. While FIG. 7 shows the red active areas R and green active areas G of each device structure being completely encompassed within the active area B of a single blue OLED for ease of illustration, this is not necessarily true. Some of the active areas R and G may extend outside active area B. It is preferred that active areas R and G fill as much as possible of active area B, such that in a preferred configuration the outer edges of active areas R and G would align and be superposed with the edges of active area B, as illustrated in FIG. 8.

FIG. 8 illustrates how it is possible to obtain an active area B that is significantly greater than the sum of active areas R and G, due to non-emitting areas between red and green devices. FIG. 8 is drawn roughly to scale. FIG. 8 shows an array of red OLEDs R and green OLEDs G, superposed with a larger square blue OLED B. FIG. 8 corresponds to device structure 730 of FIG. 7, where the active areas of a 2×2 array of red and green OLEDs extend to the edge of the active area of a superposed blue OLED. A fill factor of 25% for an array of square devices used in a display is readily obtained by known methods, and is a reasonable fill factor for the smallest devices in a given commercial device. A fill factor of 25% corresponds to square devices separated by a distance equal to the length of the edge of a device, as illustrated for the array of red and green OLEDs R and G. Blue OLEDs B have an active area significantly larger than the sum of the red and green active areas because blue active area is not only superposed with green and red active area, but is also present in many of the spaces between red and green active area. As can be seen from the illustration of FIG. 8, the active area of the blue OLEDs B is greater than the sum of the active areas of the red and green OLEDs R and G by a ratio of 9:4, i.e., the active area of the blue OLEDs B is 2.25 times greater than the sum of the active areas of the red and green OLEDs R and G.

Using a square blue OLED, and an array of red and green OLED that extend to the edge of the blue OLED with a separation distance that is equal to the dimension of the smallest edge of the red and green OLEDs, a similar calculation can be done for other configurations. For a 2×1 array of red and green OLEDs as illustrated in device structure 710, the active area of the blue OLED is 1.5 times greater than the sum of the active areas of the red and green OLEDs R and G. For a 3×2 array of red and green OLEDs as illustrated in device structure 720, the blue OLED would be 5×5 units while the red and green OLEDs are 1×2 units separated by 1 unit, such that the active area of the blue OLED is 25:12 or 2.083 times greater than the sum of the active areas of the red and green OLEDs R and G. For a 4×4 array of red and green OLEDs as illustrated in device structure 740, the active area of the blue OLED is 49:16 or 3.062 times greater than the sum of the active areas of the red and green OLEDs R and G.

In one embodiment, the integrated OLED structure comprises exactly one green emitting OLED and exactly one red emitting OLED superposed with exactly one blue emitting OLED. In this embodiment, the first (blue) active area is preferably at least 1.5 times greater than the sum of the second (green) and third (red) active areas.

In one embodiment, the integrated OLED structure comprises exactly two green emitting OLEDs and exactly two red emitting OLEDs superposed with exactly one blue emitting OLED. In this embodiment, the first (blue) active area is preferably at least 2.25 times greater than the sum of the second (green) and third (red) active areas.

In one embodiment, the integrated OLED structure comprises exactly three green emitting OLEDs and exactly three red emitting OLEDs superposed with exactly one blue emitting OLED. In this embodiment, the first (blue) active area is at least 2.083 times time greater than the sum of the second (green) and third (red) active areas.

In one embodiment, the integrated OLED structure comprises exactly eight green emitting OLEDs and exactly eight red emitting OLEDs superposed with exactly one blue emitting OLED. In this embodiment, the first (blue) active area is preferably at least 3 times time greater than the sum of the second (green) and third (red) active areas.

The human visual system is able to resolve spatial differences in the horizontal and vertical dimensions with about the same precision, which is one reason why square pixels are preferred in a display. Moreover, the human visual system is able to resolve spatial differences for the colors green and red with about twice the precision as it is able to resolve spatial differences for the color blue. This is explained further in the paper Silverstein et al, *Hybrid spatial-temporal color synthesis and its applications*, Journal of the SID 14/1, 2006. Another reason to prefer square pixels is to preserve the aspect ratio and symmetry of image content rendered on a display. As a result, it is preferred that there are two green OLEDs and two red OLEDs per blue OLED, as illustrated in device structure 730.

Although FIGS. 7 and 8 show only square blue OLEDs and square or rectangular red and green OLEDs arranged in a square matrix. Embodiments of the invention may be used with other shapes and other arrangements of devices that are sometimes used in displays, such as a delta triad mosaic or a PenTile mosaic.

The first device may be a consumer product.

The first device may be an OLED panel.

Preferably, the red emitting OLED, the green emitting OLED and the blue emitting OLED are phosphorescent OLEDs. The architectures described herein may be particularly useful in the context of phosphorescent OLEDs, particularly blue phosphorescent OLEDs, because the larger blue emissive area may compensate for weaknesses in blue phosphorescent emitting materials such as low lifetimes by requiring less usage of any given region of blue emitting OLED.

In one embodiment, a method of fabricating an integrated OLED structure having a common cathode disposed over a single substrate is provided. The integrated OLED structure includes a blue-emitting OLED, a green emitting OLED, and a red emitting OLED. The blue emitting OLED has a first active area defined by a first electrode of the blue emitting OLED disposed in a first plane. The green emitting OLED has a second active area. The red emitting OLED has a third active area. The second and third active areas are disposed in a second plane superposed with the first plane. The first and second planes are separated by a common electrode that is common to the blue emitting OLED, the green emitting OLED and the red emitting OLED. The method comprises depositing, in order, over a substrate:

(1) an electrode layer CA that includes a first electrode of a red emitting OLED and a first electrode of a green emitting OLED;

(2) a non-emitting organic layer CB common to the red emitting and green emitting OLEDs;

(3) an emitting layer CC that includes an emitting layer of the green emitting OLED that corresponds to the second active area, and an emitting layer of the red emitting OLED that corresponds to the third active area;

(4) a non-emitting layer CD common to the red emitting and green emitting OLEDs;

(5) an electrode layer CE that includes the common electrode, wherein the common electrode is the second electrode of the green emitting OLED, the second electrode of the red emitting OLED, and the first electrode of the blue emitting OLED;

(6) an emitting layer CF that includes an emitting layer of the blue emitting OLED;

(7) an electrode layer CG that includes a second electrode of the blue emitting OLED.

In one embodiment, a method of fabricating an integrated OLED structure having a passivation layer disposed over a single substrate is provided. The integrated OLED structure includes a blue-emitting OLED, a green emitting OLED, and a red emitting OLED. The blue emitting OLED has a first active area defined by a first electrode of the blue emitting OLED disposed in a first plane. The green emitting OLED has a second active area. The red emitting OLED has a third active area. The second and third active areas are disposed in a second plane superposed with the first plane. The first and second planes are separated by a passivation layer. The method comprises depositing, in order, over a substrate:

(1) an electrode layer PA that includes a first electrode of the blue emitting OLED;

(2) an emitting layer PB that includes an emitting layer of the blue emitting OLED;

(3) an electrode layer PC that includes a second electrode of the blue emitting OLED;

(4) a passivation layer PD;
(5) an electrode layer PE that includes a first electrode of the red emitting OLED and a first electrode of the green emitting OLED,
(6) a non-emitting organic layer PF common to the red emitting and green emitting OLEDs;
(7) an emitting layer PG that includes an emitting layer of the green emitting OLED that corresponds to the second active area, and an emitting layer of the red emitting OLED that corresponds to the third active area;
(8) a non-emitting layer PH common to the red emitting and green emitting OLEDs; and
(9) an electrode layer PI that includes a common electrode, wherein the common electrode is the second electrode of the green emitting OLED, and the second electrode of the red emitting OLED.

The methods described herein may be practiced in conjunction with many of the specific features and embodiments described in more detail above with respect to device structures.

As used herein, a "red" OLED has an emission spectra having a peak wavelength in the visible spectrum of 580-700 nm, a "green" OLED has an emission spectra having a peak wavelength in the visible spectrum of 500-580 nm, and a "blue" OLED has an emission spectra having a peak wavelength in the visible spectrum of 400-500 nm As used herein, "fill factor" refers to the ratio of the area of emissive device surface to an outline of the area that includes emissive device surface. Fill factor is intended to quantify the inactive area between devices, where a high fill factor corresponds to a low inactive area between devices. Fill factor is also affected by any device area that does not emit light that reaches a viewer for whatever reason, such as placement of thin-film transistors that are not transparent. Thus, any inactive panel area around the periphery of a panel with no devices is not considered in the calculation of fill factor as used herein.

Embodiments of the invention may be used for displays capable of displaying images. Embodiments of the invention may be used for general illumination purposes, where the light source may or may not be color tunable. While a light source that produces white light is a preferred embodiment, other colors of light may also be produced.

It is understood that the various embodiments described herein are by way of example only, and are not intended to limit the scope of the invention. For example, many of the materials and structures described herein may be substituted with other materials and structures without deviating from the spirit of the invention. Many of the specific arrangements of sub-pixels may be modified without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A first device, comprising:
    an integrated OLED structure disposed over a single substrate, the integrated OLED structure including a blue-emitting OLED, a green emitting OLED, and a red emitting OLED;
    wherein:
    the blue emitting OLED has a first active area defined by a first electrode of the blue emitting OLED disposed in a first plane, wherein the first active area is at least partially superposed with the first electrode and the first active area is at least partially superposed with a second electrode;
    the green emitting OLED has a second active area;
    the red emitting OLED has a third active area;
    the second and third active areas are disposed in a second plane different from and parallel to the first plane;
    the first and second planes are separated by a common electrode that is common to the blue emitting OLED, the green emitting OLED, and the red emitting OLED;
    each of the second and third active areas are at least partially superposed with the first electrode; and
    at least one of the second active area and the third active area is at least partially superposed with the second electrode.

2. The first device of claim 1, wherein the integrated OLED structure includes, in order disposed over the substrate:
    an electrode layer CA that includes a first electrode of the red emitting OLED and a first electrode of the green emitting OLED,
    a non-emitting organic layer (CB) common to the red emitting and green emitting OLEDs;
    an emitting layer (CC) that includes an emitting layer of the green emitting OLED that corresponds to the second active area, and an emitting layer of the red emitting OLED that corresponds to the third active area;
    a non-emitting layer (CD) common to the red emitting and green emitting OLEDs;
    an electrode layer (CE) that includes the common electrode, wherein the common electrode is the second electrode of the green emitting OLED, the second electrode of the red emitting OLED, and the first electrode of the blue emitting OLED;
    an emitting layer (CF) that includes an emitting layer of the blue emitting OLED;
    an electrode layer (CG) that includes a second electrode of the blue emitting OLED.

3. The first device of claim 2, wherein the first electrode of the red emitting OLED, the first electrode of the green emitting OLED, and the second electrode of the blue emitting OLED are separately addressable.

4. The first device of claim 2, wherein the first electrode of the red emitting OLED, the first electrode of the green emitting OLED, and the second electrode of the blue emitting OLED are not separately addressable.

5. The first device of claim 2, wherein:
    the first electrode of the red emitting OLED and the first electrode of the green emitting OLED are anodes;
    the second electrode of the green emitting OLED, the second electrode of the red emitting OLED, and the first electrode of the blue emitting OLED are cathodes; and
    the second electrode of the blue emitting OLED is an anode.

6. The first device of claim 1, wherein:
    each of the second and third active areas are completely superposed with the first active area.

7. The first device of claim 1, wherein the integrated OLED structure includes, in order disposed over the substrate:
    an electrode layer (PA) that includes a first electrode of the blue emitting OLED;
    an emitting layer (PB) that includes an emitting layer of the blue emitting OLED;
    an electrode layer (PC) that includes a second electrode of the blue emitting OLED;
    a passivation layer (PD);
    an electrode layer (PE) that includes a first electrode of the red emitting OLED and a first electrode of the green emitting OLED,
    a non-emitting organic layer (PF) common to the red emitting and green emitting OLEDs;

an emitting layer (PG) that includes an emitting layer of the green emitting OLED that corresponds to the second active area, and an emitting layer of the red emitting OLED that corresponds to the third active area;

a non-emitting layer (PH) common to the red emitting and green emitting OLEDs;

an electrode layer (PI) that includes a common electrode, wherein the common electrode is the second electrode of the green emitting OLED, and the second electrode of the red emitting OLED.

8. The first device of claim 7, wherein the first electrode of the red emitting OLED, the first electrode of the green emitting OLED, and the first electrode of the blue emitting OLED are separately addressable.

9. The first device of claim 7, wherein the first electrode of the red emitting OLED, the first electrode of the green emitting OLED, and the first electrode of the blue emitting OLED are not separately addressable.

10. The first device of claim 1, wherein:
the first electrode of the red emitting OLED and the first electrode of the green emitting OLED are anodes;
the second electrode of the green emitting OLED and the second electrode of the red emitting OLED are cathodes;
the first electrode of the blue emitting OLED is an anode;
the second electrode of the blue emitting OLED is a cathode.

11. The first device of claim 1, wherein the integrated OLED structure comprises exactly one green emitting OLED and exactly one red emitting OLED superposed with exactly one blue emitting OLED.

12. The first device of claim 11, wherein the first active area is at least 1.5 time greater than the sum of the second and third active areas.

13. The first device of claim 1, wherein the integrated OLED structure comprises exactly two green emitting OLEDs and exactly two red emitting OLEDs superposed with exactly one blue emitting OLED.

14. The first device of claim 13, wherein the first active area is at least 2.25 times greater than the sum of the second and third active areas.

15. The first device of claim 1, wherein the integrated OLED structure comprises exactly three green emitting OLEDs and exactly three red emitting OLEDs superposed with exactly one blue emitting OLED.

16. The first device of claim 15, wherein the first active area is at least 2.083 times greater than the sum of the second and third active areas.

17. The first device of claim 1, wherein the integrated OLED structure comprises exactly eight green emitting OLEDs and exactly eight red emitting OLEDs superposed with exactly one blue emitting OLED.

18. The first device of claim 17, wherein the first active area is at least 3 times time greater than the sum of the second and third active areas.

19. The first device of claim 1, wherein the first device is a consumer product.

20. The first device of claim 1, wherein the first device is an OLED panel.

21. The first device of claim 1, wherein the red emitting OLED, the green emitting OLED and the blue emitting OLED are phosphorescent OLEDs.

22. The first device of claim 1, wherein each of the second and third active areas is at least partially superposed with the second electrode.

23. The first device of claim 1, wherein each of the first, second, and third active areas is at least partially superposed with a third electrode.

24. A method of fabricating an integrated OLED structure disposed over a single substrate, the integrated OLED structure including a blue-emitting OLED, a green emitting OLED, and a red emitting OLED; wherein:
the blue emitting OLED has a first active area defined by a first electrode of the blue emitting OLED disposed in a first plane, the first active area being at least partially superposed with the first electrode and the first active area being at least partially superposed with a second electrode;
the green emitting OLED has a second active area at least partially superposed with the first electrode;
the red emitting OLED has a third active area at least partially superposed with the first electrode;
at least one of the second active area and the third active area is at least partially superposed with the second electrode;
the second and third active areas are disposed in a second plane superposed with the first plane; and
the first and second planes are separated by a common electrode that is common to the blue emitting OLED, the green emitting OLED and the red emitting OLED;
the method comprising depositing, in order, over a substrate:
an electrode layer (CA) that includes a first electrode of a red emitting OLED and a first electrode of a green emitting OLED;
a non-emitting organic layer (CB) common to the red emitting and green emitting OLEDs;
an emitting layer (CC) that includes an emitting layer of the green emitting OLED that corresponds to the second active area, and an emitting layer of the red emitting OLED that corresponds to the third active area;
a non-emitting layer (CD) common to the red emitting and green emitting OLEDs;
an electrode layer (CE) that includes the common electrode, wherein the common electrode is the second electrode of the green emitting OLED, the second electrode of the red emitting OLED, and the first electrode of the blue emitting OLED;
an emitting layer (CF) that includes an emitting layer of the blue emitting OLED;
an electrode layer (CG) that includes a second electrode of the blue emitting OLED.

25. A method of fabricating an integrated OLED structure disposed over a single substrate, the integrated OLED structure including a blue-emitting OLED, a green emitting OLED, and a red emitting OLED; wherein:
the blue emitting OLED has a first active area defined by a first electrode of the blue emitting OLED disposed in a first plane, the first active area at least partially superposed with the first electrode and the first active area at least partially superposed with a second electrode;
the green emitting OLED has a second active area at least partially superposed with the first electrode;
the red emitting OLED has a third active area at least partially superposed with the first electrode;
at least one of the second active area and the third active area is at least partially superposed with the second electrode;
the second and third active areas are disposed in a second plane superposed with the first plane; and
the first and second planes are separated by a passivation layer;
the method comprising depositing, in order, over a substrate:

an electrode layer (PA) that includes a first electrode of the blue emitting OLED;

an emitting layer (PB) that includes an emitting layer of the blue emitting OLED;

an electrode layer (PC) that includes a second electrode of the blue emitting OLED;

a passivation layer (PD);

an electrode layer (PE) that includes a first electrode of the red emitting OLED and a first electrode of the green emitting OLED, a non-emitting organic layer (PF) common to the red emitting and green emitting OLEDs;

an emitting layer (PG) that includes an emitting layer of the green emitting OLED that corresponds to the second active area, and an emitting layer of the red emitting OLED that corresponds to the third active area;

a non-emitting layer (PH) common to the red emitting and green emitting OLEDs; an electrode layer (PI) that includes a common electrode, wherein the common electrode is the second electrode of the green emitting OLED, and the second electrode of the red emitting OLED.

\* \* \* \* \*